(12) United States Patent
Kuang et al.

(10) Patent No.: US 10,292,294 B2
(45) Date of Patent: May 14, 2019

(54) CORNER TRANSITION MODULE AND LED DISPLAY APPLICATION THEREOF

(71) Applicant: YAHAM OPTOELECTRONICS CO., LTD., Guangdong (CN)

(72) Inventors: Ye Kuang, Shenzhen (CN); Ou Li, Shenzhen (CN); Yiqiu Lu, Shenzhen (CN); Weiqi Jiao, Shenzhen (CN); Tao Zhong, Shenzhen (CN)

(73) Assignee: YAHAM OPTOELECTRONICS CO., LTD, Shenzhen, Guangdong (CN)

( * ) Notice: Subject to any disclaimer, the term of this patent is extended or adjusted under 35 U.S.C. 154(b) by 574 days.

(21) Appl. No.: 14/906,895

(22) PCT Filed: Sep. 7, 2015

(86) PCT No.: PCT/CN2015/089013
§ 371 (c)(1),
(2) Date: Jan. 21, 2016

(87) PCT Pub. No.: WO2016/054958
PCT Pub. Date: Apr. 14, 2016

(65) Prior Publication Data
US 2016/0234959 A1    Aug. 11, 2016

(30) Foreign Application Priority Data
Oct. 8, 2014 (CN) .......................... 2014 1 0529290

(51) Int. Cl.
*H05K 7/14* (2006.01)
*G09F 9/33* (2006.01)
(Continued)

(52) U.S. Cl.
CPC ......... *H05K 7/1427* (2013.01); *G09F 9/3026* (2013.01); *G09F 9/33* (2013.01);
(Continued)

(58) Field of Classification Search
CPC ........... G09F 9/3026; G09F 9/33; H05K 1/14; H05K 2201/09018; H05K 2201/10106; H05K 2201/10128; H05K 7/1427
See application file for complete search history.

(56) References Cited

U.S. PATENT DOCUMENTS

2013/0329444 A1* 12/2013 Oh .......................... F21V 21/00
362/543

FOREIGN PATENT DOCUMENTS

CN            103065558        *    4/2013

* cited by examiner

*Primary Examiner* — James Wu
(74) *Attorney, Agent, or Firm* — Raymond Y. Chan; David and Raymond Patent Firm (57) ABSTRACT

A corner transition module includes a module case, a LED PCB board, a curved face cover. The LED PCB board is set in the space defined between the module case and the curved face cover. The module case is mounted on a LED installing position. A plurality of LED installing holes is provided on the curved face cover to couple with the LEDs on the LED PCB board. The corner transition module solves the problem that two flat display screens being angularly connected in resulting in a display defects with a black line at the connecting corner. With the corner transition module, the non-planar screens are seamlessly connected to form a perfect full-screen display effect in high-performance graphics display without any black line.

7 Claims, 9 Drawing Sheets

(51) Int. Cl.
*G09F 9/302* (2006.01)
*H05K 1/14* (2006.01)
(52) U.S. Cl.
CPC ..... *H05K 1/14* (2013.01); *H05K 2201/09018* (2013.01); *H05K 2201/10106* (2013.01); *H05K 2201/10128* (2013.01)

CORNER TRANSITION MODULE AND LED DISPLAY APPLICATION THEREOF

CROSS REFERENCE OF RELATED APPLICATION

This is a non-provisional application that claims priority to international application number PCT/CN2015/089013, international filing date Sep. 7, 2015, which claims priority to Chinese application number CN201410529290, filed Oct. 8, 2014.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to LED display technology, and more particularly relates to a corner transition module and its application in LED display Description of Related Arts A conventional LED display is a display device working via LED light-emitting array, it has advantages such as high brightness, low working voltage, low power consumption, large scale, long product life, impact resistance and stable performance, which makes it been widely used in many fields.

The conventional LED display, which is generally a rectangular or square planar structure, comprises a plurality of LED display module, each of the display module comprises of an outer case, a display module set on the surface of the outer case, a display control circuit set in the outer case, the LED light-emitting array is set on the display module. With the current technology, the LED display modules are all configured in a planar structure.

Figure 1:
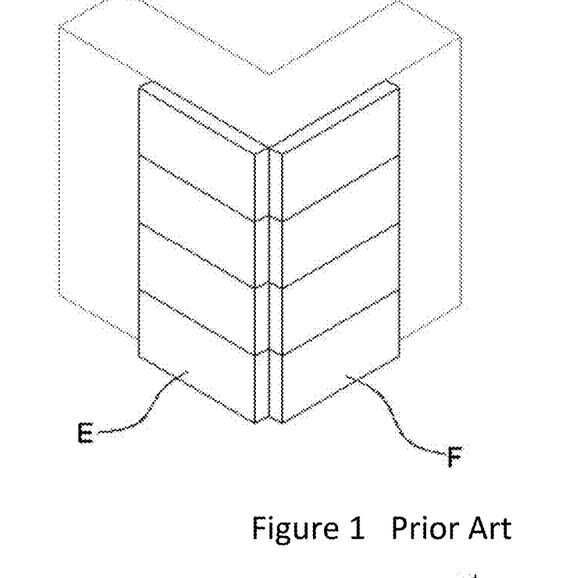
FIG. 1 illustrates a conventional display screen structure 1.
Figure 2:
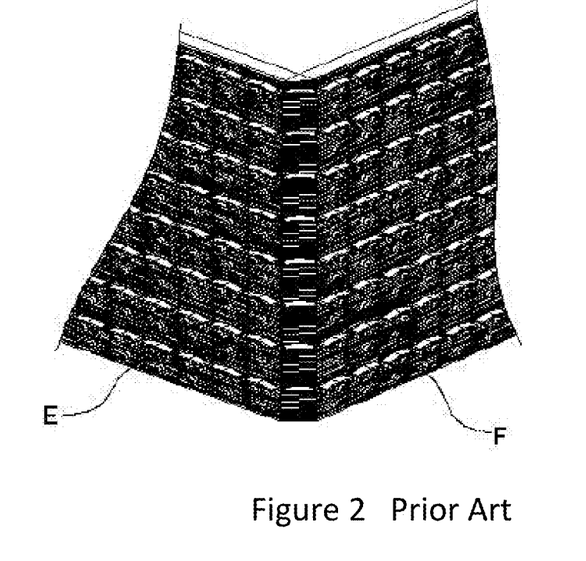
FIG. 2 illustrates a conventional display screen structure 2.

With the rapid development of LED technology, LED applications are widely used with diverse market demand, and the requirements for LED display are increasingly high. Referring to FIGS. 1 and 2, when two display screens are angularly connected with conventional display production process, a gap will be formed at the connecting corner between the two display screens. In other words, there is a blank display space, which leads to a result that the display cannot be formed in a seamless manner. As a result, a blank black line as a display defect will be formed on the display image between the two display screens.

SUMMARY OF THE PRESENT INVENTION

An object of the present invention is to provide a corner transition module and LED display application thereof, which can overcome the display defect of current LED display when angled connecting. With the corner transition module, the LED display can achieve a seamless display effect to remove the black lines appear in the image display, especially when a sharp corner is formed between two display screens.

According to the present invention, the foregoing and other objects and advantages are attained by a corner transition module which comprises a module case, a LED circuit board, such as a LED PCB broad, and a curved face cover. The LED PCB broad is provided in a space defined between the module case and the curved face cover. The module case is built in a plurality of LED installing point. The curved face cover is provided with a plurality of installing holes which couple with size of LED on the LED PCB board.

The cross-section of the module case has an arc-shape, which has an open end and a close end. The curved face cover is provided at the open end of the module case.

When two flat side screen are connected with a connecting angle between 90° and 180°, the parameters of the module case can be obtained according to the following formula:

$$A = 180 - B \tag{1}$$

$$[R - h/\cos(A/2)] * \sin(A/2) = D/2 \tag{2}$$

$$A = N * \operatorname{Arc}\sin(d/2R) \tag{3}$$

Wherein, L>20N is a positive integer, N is the number of literally arranged LED dot pixel on LED PCB board, d is the length between dots, h is thickness of the module case, B is the intersection angle of two flat side screen, L is the curve length of the LED light surface, R is radius of curvature of the module case, A is the centering angle of the module case, D is the width of the module case, wherein D is determined by the dimensions of the LED PCB board and the sizes of inlet and outlet holes. And the value of D is determined based on a specific demand.

The corner transition module, wherein the length between the LED dot pixel on the LED PCB and the adjacent dot pixel on the side screen is the same or nearly the same as the length between the dot pixel on LED PCB board itself and on the side screen.

The height of the apex of the curved face cover is calculated using the following formula:

$$H = d4 - X, \text{ where } X \text{ is between 0.3 and 0.5 with the same unit of length of } d4,$$

Wherein, by using the intersection of the extension line (proximal direction) of the hypotenuse of the module case as a center, and then taking any vertex of the side of the curved face cover d1 or d2 to draw an arc, the highest point of the arc d4 is determined.

The LED display comprises any one of the corner transition module.

The LED display comprises any two of the corner transition. Each of the corner transition module is horizontally arranged N pixel dots:

$$A = (180 - B)/2$$

$$R/(R - h) = Nd/D$$

$$N(R - h) * \sin(A/2) = DR$$

Wherein, B is the intersection angle of the two planes. In addition, for corner transition of the LED display, the light surface is a small arc surface, wherein L is the arc length, R is the radius of arc, A is the arc center angle, and D is the width of the module case.

With the above technical solution, the corner transition module of the present invention solves the display defect that a no display black line will show on the whole screen when two flat side screens are angularly connected. So that the non-planar screen can be seamless and reach a perfect full-screen display effect in high-performance graphics display without any black lines.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Embodiment 1

Referring to FIGS. 3 to 8, the first embodiment of the present invention disclosed a corner transition module which comprises a module case 1 such as a bottom case, a LED PCB board 2, and a curved face cover 3.

The cross-section of the module case 1 has an arc-shape, which has an open end and a close end, wherein the arc-length of the open end is larger than that of the closed end. The module case 1 is provided with at least a LED installing point 11. It is worth mentioning that the module case 1 can be configured to have a trapezoid cross section.

Considering to form the seamless between two intersecting screens, the LED dot pixel spacing should be consistent or approximately the same. That is, the distance between the LED dot pixel on the LED PCB board 2 and the adjacent dot pixel on the side screen is equal or approximately equal as the length between the dot pixel on LED PCB board 2 itself and on the side screen.

To guarantee seamless display, the module case 1 is one of the key elements, i.e. the structure and the shape of the module case 1. In other words, the angle of the sector structure must ensure the arrangement of LED in transition modules is consistent with the arrangement of LED modules on both sides of display screens of the flat side screens.

Figure 9:
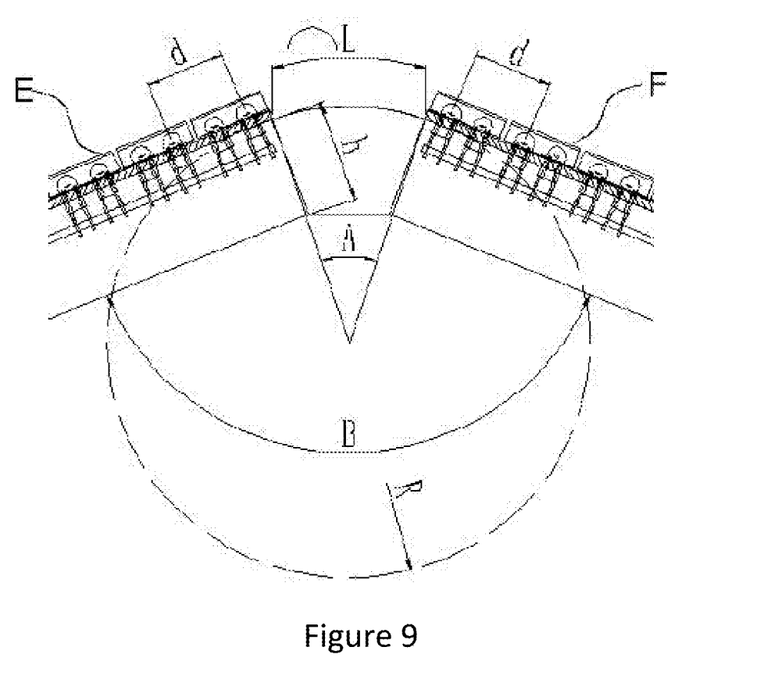
FIG. 9 illustrates the schematic structural view of the module case and the adjacent display screen according to the first preferred embodiment of the present invention.

Referring to FIG. 9, according to the appearance of the adjacent screen, when the two flat side screens are intersected, the intersection angle is between 90° to 180°.

$$A=180-B \tag{1}$$

$$[R-h/\cos(A/2)]*\sin(A/2)=D/2 \tag{2}$$

$$A=N*\text{Arc }\sin(d/2R) \tag{3}$$

In condition, L>20N is a positive integer.

Wherein, N is the number of literally arranged LED dot pixel on LED PCB board 2. d is the length between dot pixels, h is thickness of the module case 1. D is the width of the module case 1, wherein D is determined by the dimensions of the LED PCB board 2 and the sizes of inlet and outlet holes. And the value of D is determined based on a specific demand. B is the intersection angle of two flat side screens. In addition, for corner transition of the LED display, the light surface is a small arc surface, wherein L is the arc length, R is the radius of arc, A is the arc center angle.

In actual prediction operation, the value of N can be preset to determine the size of module case 1. In the range of all possible values of N, there will be many solutions. But considering the design requirements, only one optimal solution will be accepted. And based on that, one can get the value of L, R and A.

Figure 3:
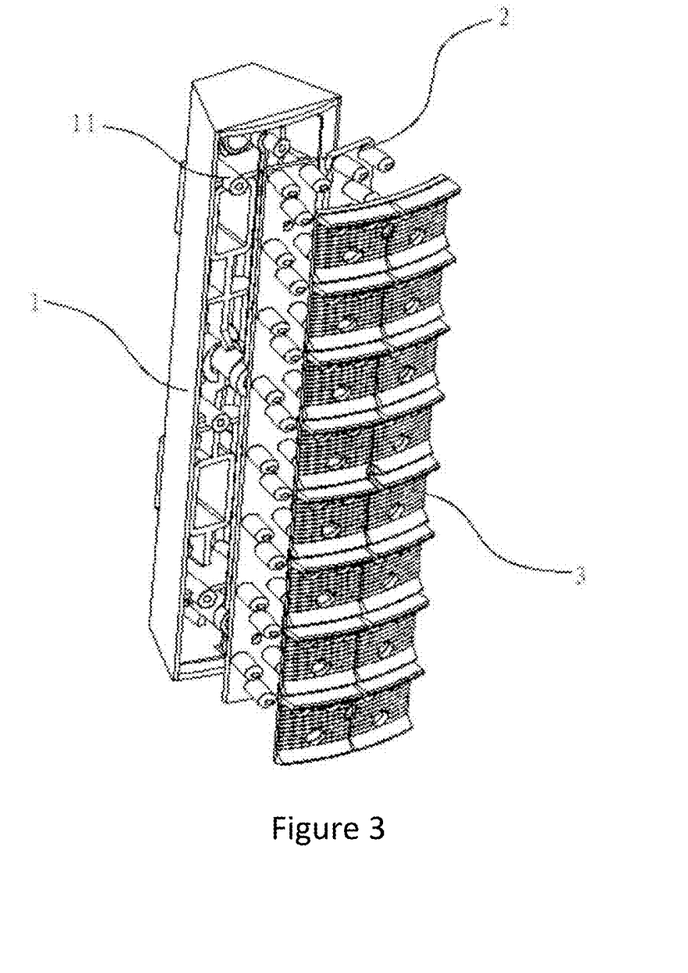
FIG. 3 illustrates an exploded schematic perspective of the corner transition module according to a first preferred embodiment of the present invention.
Figure 4:
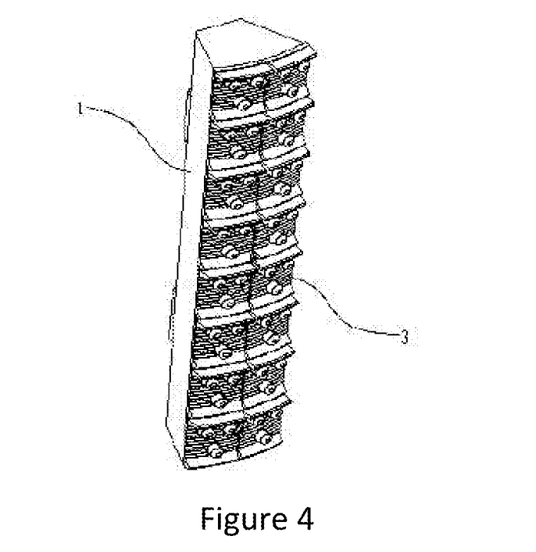
FIG. 4 illustrates a combined schematic perspective of the corner transition module according to the first preferred embodiment of the present invention.
Figure 5:
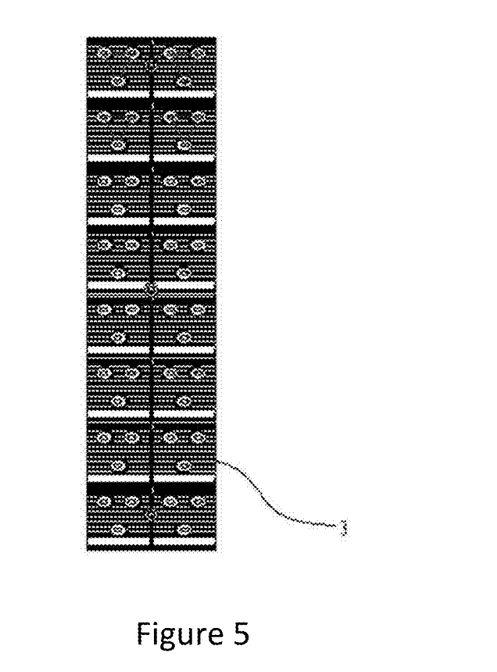
FIG. 5 illustrates the front view of the FIG. 4 according to the first preferred embodiment of the present invention.
Figure 6:
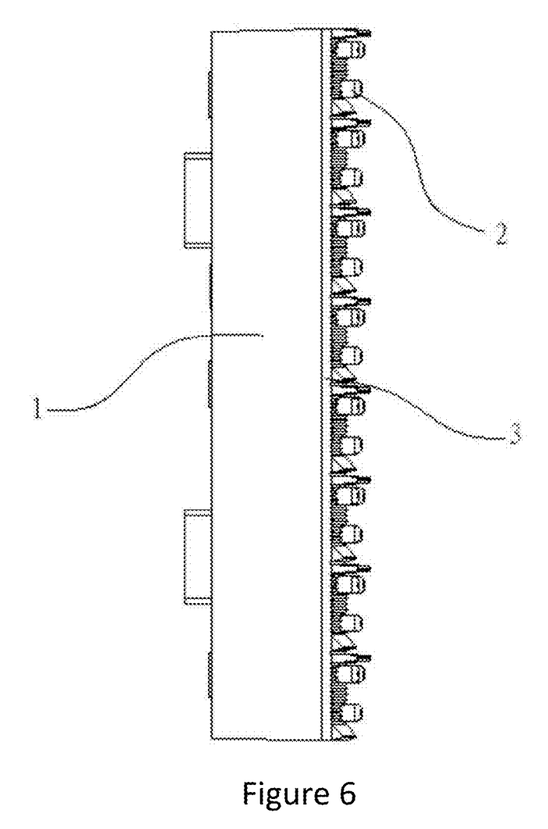
FIG. 6 illustrates the side view of the FIG. 4 according to the first preferred embodiment of the present invention.
Figure 7:
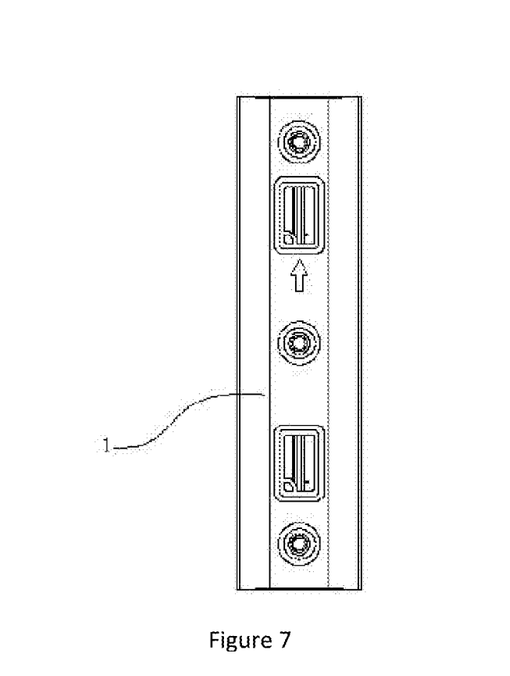
FIG. 7 illustrates the rear view of the FIG. 4 according to the first preferred embodiment of the present invention.
Figure 8:
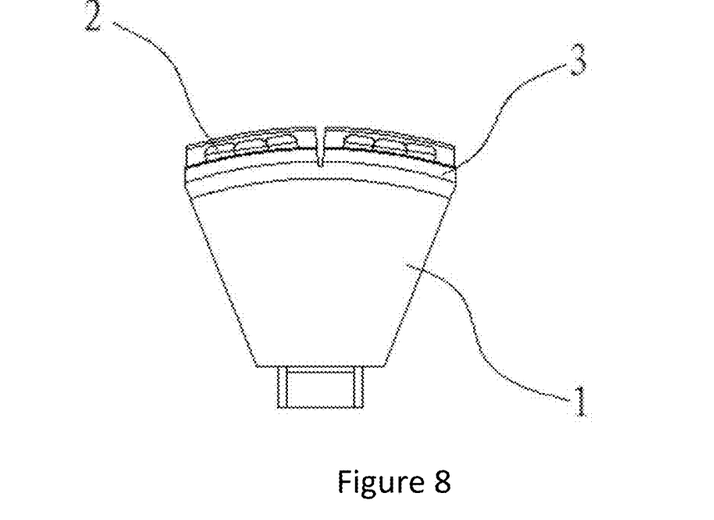
FIG. 8 illustrates the top view of the FIG. 4 according to the first preferred embodiment of the present invention.
Figure 10:
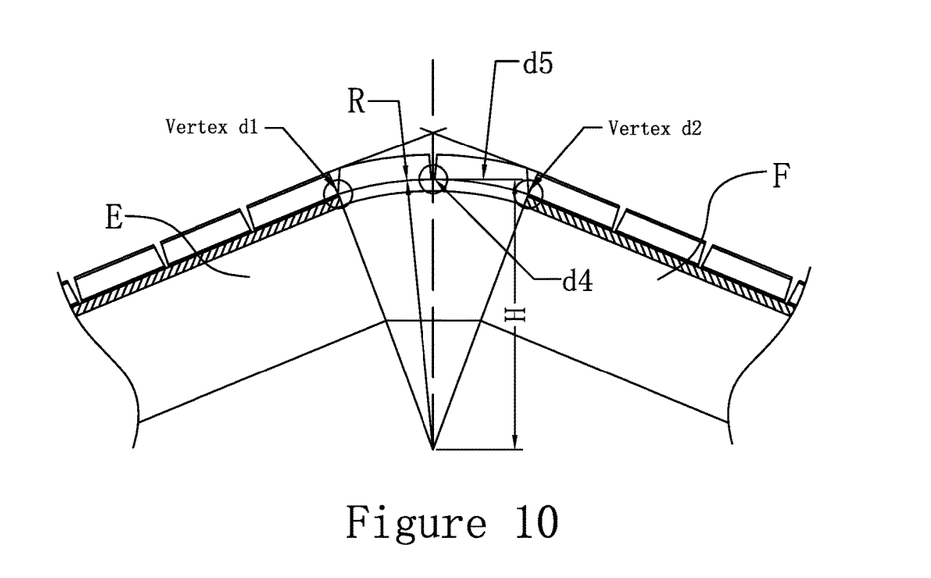
FIG. 10 illustrates schematic design 1 of the curved face cover according to the first preferred embodiment of the present invention.

Referring to FIGS. 3 and 10, a plurality of LED installing holes are provided on the curved face cover 3 to couple with the LEDs on the LED PCB board 2. The LED PCB board 2 is set in the space defined between the module case 1 and the curved face cover 3. In other words, the LED PCB board 2 is set in the open end of the module case 1. The curvature of the curved face cover 3 matches with the open end size of the module case 1.

By using the intersection of the extension line (proximal direction) of the hypotenuse of the module case as a center, and then taking any vertex of the side of the curved face cover d1 or d2 to draw an arc, the highest point of the arc d4 is determined. And move the d4 towards the center direction for 0.3 to 0.5 mm. The arc shape R is the curved contour for subsequent structure design for the curved face cover 3. The height of the vertex d4 can be calculated as the following:

$H=d4-X$, where $X$ is between 0.3 and 0.5 with the same unit of length of $d4$;

Referring to FIG. 10, d5 is the LED light emitting point (referring to specifications of each LED manufacturers).

Use this formula to calculate the height of the vertex d4.

Figure 11:
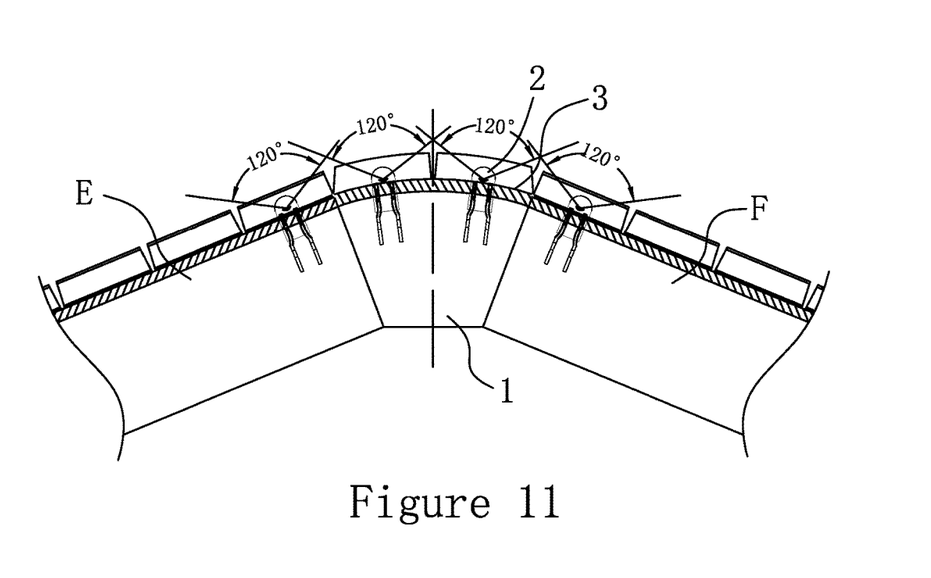
FIG. 11 illustrates schematic design 2 of the curved face cover according to the first preferred embodiment of the present invention.

Referring to FIGS. 10 and 11, when the circular arc radius R is fixed, the height H of any point on the arc R is equal to a certain value. In the design, the highest point d4 of the curved face cover 3 is lower than the LED emitting point d5, thus the light of LED 2 is not blocked with the luminous light range of 120 degree, which can form a good light match with side flat display module. (Note: the viewing angle of most current LED line lights are 120 degree).

The corner transition module of the present invention solves the display defect that a no display black line will show on the whole screen when two flat side screens are angularly connected. Each flat side screen comprises a bottom case, a LED board, and a casing. The LED PCB board 2 is configured in curved shape to alignedly extend between two LED boards of the two flat side screens edge-to-edge, wherein the module case 1 is alignedly coupled between two bottom cases of the two flat side screens side-by-side. So that the non-planar screen can be seamless and reach a perfect full-screen display effect in high-performance graphics display without any black lines.

When in use, the module case 1 is a connecting member to connect the cases of the two screen displays side-by-side, wherein the LED PCB board 2 and the curved face cover 3 are mounted on the module case 1, together form the corner transition module. And the module case 1 is fixedly mounted on a fix plate. The connecting part between the module case 1 and the LED PCB board 2 has an angularly bevel processing.

Figure 12:
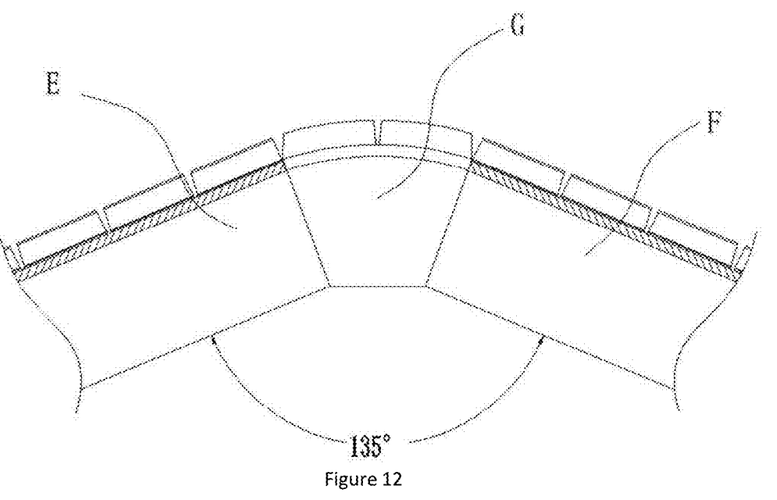
FIG. 12 illustrates a schematic plan view of the corner transition module in display application according to the first preferred embodiment of the present invention.
Figure 13:
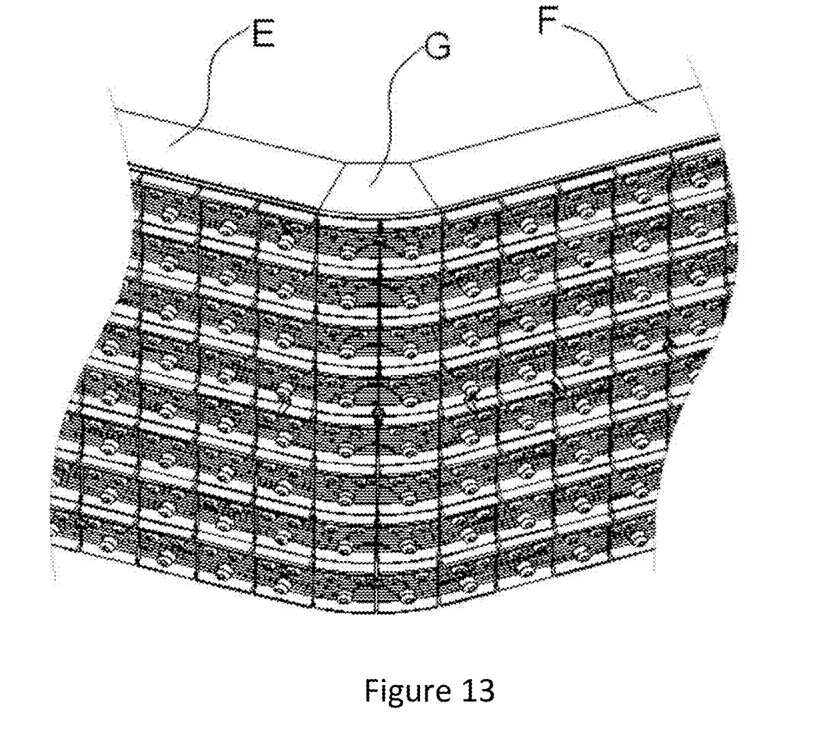
FIG. 13 illustrates a perspective view of the corner transition module in display application according to the first preferred embodiment of the present invention.

In addition, referring to FIGS. 12 and 13, the present invention also provides a LED display with corner transition module G. it can be seen the curve of the curved face cover 3 is approximately tangent to the side flat display module E and F with a smooth transition which is good for the LED light match between the corner transition module G and the flat display module. In addition, the arc process, which is different from conventional flat display screen, can meet the aesthetic requirement of the audience.

Embodiments 2

The connecting angle size can directly affect the connecting effect. Different connecting solution will be taken when the connecting angle is change. Two corner transition modules are taken for small angle transition connecting, while one corner transition module is for large connecting angle plan.

Figure 14:
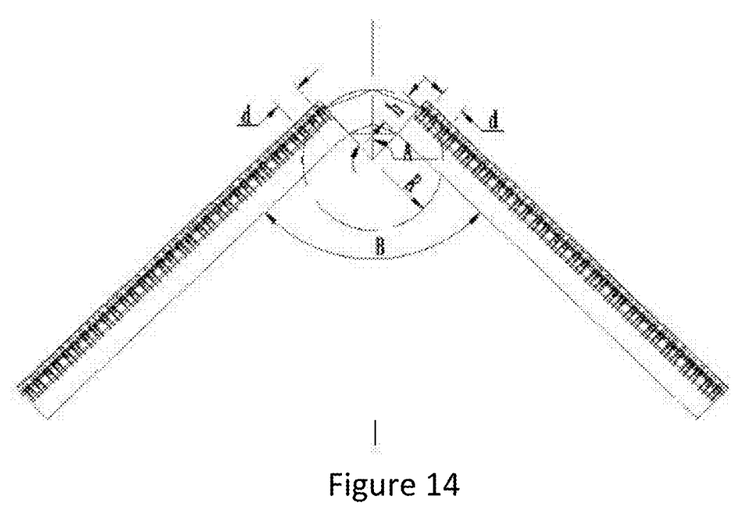
FIG. 14 illustrates a schematic diagram of a second preferred embodiment of the present invention.

Referring to FIG. 14, for plug-in LED, two corner transition modules are needed display when the corner angle is smaller than 135°. Each of the corner transition modules has N dot pixels horizontally arranged.

$$A=(180-B)/2 \qquad (4)$$

$$R/(R-h)=Nd/D \qquad (5)$$

$$N(R-h)*\sin(A/2)=DR \qquad (6)$$

Wherein, B is the intersection angle of the two planes. In addition, for corner transition of the LED display, the light surface is a small arc surface, wherein L is the arc length, R is the radius of arc, A is the arc center angle, and D is the width of the module case.

One skilled in the art will understand that the embodiment of the present invention as shown in the drawings and described above is exemplary only and not intended to be limiting. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A corner transition module for connecting between two flat side screens at an intersection angle, comprising:
a module case;
a LED PCB board; and
a curved face cover;
wherein said LED PCB board is provided in a space between said module case and said curved face cover, wherein said module case is provided with a plurality of LED installing holes, wherein said curved face cover is provided with a plurality of LED installing holes which couple with LEDs on said LED PCB board, wherein said module case, having an arc-shaped cross section, has an open end and a close end, wherein said curved face cover is coupled at said open end of said module case, wherein when the two flat side screens are angularly connected, the intersection angle is between 90 degree and 180 degree, parameters of said corner transition module can be calculated with following formulas:

$$A=180-B \qquad (1)$$

$$[R-h/\cos(A/2)]*\sin(A/2)=D/2 \qquad (2)$$

$$A=N*\text{Arc }\sin(d/2R) \qquad (3)$$

wherein, N is a positive integer which is the number of horizontally arranged LED dot pixels on said LED PCB board; d is the length between said LED dots pixels; h is the thickness of said module case; B is the intersection angle of two said flat side screens; R is the radius of arc of said module case; A is the arc center angle of said module case; and D is the width of said module case.

2. The corner transition module, as recited in claim 1, wherein the length between the LED dot pixels on said LED PCB board and the adjacent dot pixel on side said flat side screen is equal or approximately equal as the length between the dot pixels on said LED PCB board itself and on said flat side screens.

3. The corner transition module, as recited in claim 1, wherein the height of the vertex of said curved face cover is calculated as the following:

$$H=d4-X\text{, where }X\text{ is between 0.3 and 0.5 with the same unit of length of }d4;$$

wherein using the intersection of an extension line (proximal direction) of the hypotenuse of the module case as a center, and then taking any vertex of the side of the curved face cover d1 or d2 to draw an arc, the highest point of the arc d4 is determined.

4. A corner transition module for connecting between two flat side screens at an intersection angle, comprising:
a module case;
a LED PCB board; and
a curved face cover;
wherein said LED PCB board is provided in a space between said module case and said curved face cover, wherein said module case is provided with a plurality of LED installing holes, wherein said curved face cover is provided with a plurality of LED installing holes which couple with LEDs on said LED PCB board, wherein the height of the vertex of said curved face cover is calculated as the following:

$$H=d4-X\text{, where }X\text{ is between 0.3 and 0.5 with the same unit of length of }d4;$$

wherein using the intersection of an extension line (proximal direction) of the hypotenuse of the module case as a center, and then taking any vertex of the side of the curved face cover d1 or d2 to draw an arc, the highest point of the arc d4 is determined.

5. A LED display, comprising:

two flat side screens connected angularly at an intersection angle; and a corner transition module connected between said two flat screens, each of said corner transition module comprises:

a module case;

a LED PCB board; and a curved face cover;

wherein said LED PCB board is provided in a space between said module case and said curved face cover, wherein said module case is provided with a plurality of LED installing holes, wherein said curved face cover is provided with a plurality of LED installing holes which couple with LEDs on said LED PCB board, wherein each of the corner transition module has N dot pixels horizontally arranged:

$$A=(180-B)/2$$

$$R/(R-h)=Nd/D$$

$$N(R-h)*\sin(A/2)=DR$$

wherein, B is the intersection angle of said two flat side screens; for corner transition of said LED display, a light surface is a small arc surface, wherein d is the length between LED dot pixels; h is the thickness of said module case; L is the arc length, R is the arc radius, A is the arc center angle, and D is the width of said module case.

6. The LED display, as recited in claim 5, wherein the length between the LED dot pixels on said LED PCB board and the adjacent dot pixel on side said flat side screen is equal or approximately equal as the length between the dot pixels on said LED PCB board itself and on said flat side screens.

7. The LED display, as recited in claim 5, wherein the height of the vertex of said curved face cover is calculated as the following:

$$H=d4-X, \text{ where } X \text{ is between 0.3 and 0.5 with the same unit of length of } d4;$$

wherein using the intersection of an extension line (proximal direction) of the hypotenuse of the module case as a center, and then taking any vertex of the side of the curved face cover d1 or d2 to draw an arc, the highest point of the arc d4 is determined.

* * * * *